US007132821B2

(12) United States Patent
Camara et al.

(10) Patent No.: US 7,132,821 B2
(45) Date of Patent: Nov. 7, 2006

(54) REFERENCE CURRENT GENERATION SYSTEM

(75) Inventors: Hibourahima Camara, Wappingers Falls, NY (US); Louis Lu-Chen Hsu, Fishkill, NY (US); Karl D. Selander, Hopewell Junction, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/103,314

(22) Filed: Apr. 11, 2005

(65) Prior Publication Data

US 2005/0179486 A1 Aug. 18, 2005

Related U.S. Application Data

(63) Continuation of application No. 10/249,545, filed on Apr. 17, 2003, now Pat. No. 6,891,357.

(51) Int. Cl.
*G05F 3/16* (2006.01)
*G05F 1/10* (2006.01)
*H03F 3/45* (2006.01)

(52) U.S. Cl. ........................ 323/315; 323/316; 327/539

(58) Field of Classification Search ........ 323/312–317; 327/535, 537–539, 543, 545, 546
See application file for complete search history.

(56) References Cited

U.S. PATENT DOCUMENTS

| | | | | |
|---|---|---|---|---|
| 4,814,688 | A * | 3/1989 | Colles | 323/317 |
| 4,864,216 | A | 9/1989 | Kalata et al. | |
| 5,220,534 | A | 6/1993 | Loh et al. | |
| 5,694,033 | A | 12/1997 | Wei et al. | |
| 5,952,884 | A | 9/1999 | Ide | |
| 6,057,721 | A | 5/2000 | Nolan et al. | |
| 6,087,821 | A * | 7/2000 | Kojima | 323/315 |
| 6,184,745 | B1 * | 2/2001 | Kim | 327/541 |
| 6,204,653 | B1 | 3/2001 | Wouters et al. | |
| 6,265,859 | B1 | 7/2001 | Datar et al. | |
| 6,337,595 | B1 | 1/2002 | Hsu et al. | |
| 6,343,024 | B1 | 1/2002 | Zabroda | |
| 6,377,113 | B1 * | 4/2002 | Kanno | 327/543 |

(Continued)

FOREIGN PATENT DOCUMENTS

| | | |
|---|---|---|
| JP | 59-066725 A | 4/1984 |

OTHER PUBLICATIONS

A. Boni, "Op-Amps and Startup Circuits for CMOS Bandgap References With Near 1-V Supply," IEEE Journal of Solid-State Circuits, vol. 37, No. 10 (Oct. 2002), p. 1339.

*Primary Examiner*—Matthew V. Nguyen
(74) *Attorney, Agent, or Firm*—Daryl K. Neff, Esq.

(57) ABSTRACT

Systems are provided for generating and distributing a plurality of reference currents on an integrated circuit. More particularly, an integrated circuit is provided which includes a reference current generating system. The reference current generating system includes a first reference current generator disposed at a first location of the integrated circuit which is operable to generate a plurality of first reference currents. A plurality of second reference current generators are disposed at a plurality of second locations of the integrated circuit. Each of the second reference current generators are operable to generate a second reference current from one of the plurality of first reference currents. In a particular example, the first location at which the first reference current generator is disposed is a central location and the second locations are disposed remote from the first location.

13 Claims, 6 Drawing Sheets

U.S. PATENT DOCUMENTS

| | | | | |
|---|---|---|---|---|
| 6,417,725 | B1 | 7/2002 | Aram et al. | |
| 6,498,528 | B1 * | 12/2002 | Inagaki et al. | 327/541 |
| 6,501,256 | B1 | 12/2002 | Jaussi et al. | |
| 6,507,237 | B1 | 1/2003 | Hsu et al. | |
| 6,570,371 | B1 | 5/2003 | Volk | |
| 6,635,859 | B1 | 10/2003 | Wiles, Jr. | |

* cited by examiner

REFERENCE CURRENT GENERATION SYSTEM

CROSS-REFERENCE TO RELATED APPLICATION

This application is a continuation of U.S. patent application Ser. No. 10/249,545 filed Apr. 17, 2003 now U.S. Pat. No. 6,891,357, the contents of which are hereby incorporated by reference herein.

BACKGROUND OF THE INVENTION

This invention relates to electrical circuits and more specifically to a system and method for generating reference currents, such as used in biasing signal amplifiers within an integrated circuit.

Integrated circuits, whether digital or analog in form, require reference currents. A reference current is a current source generated by the integrated circuit for the purpose of operating devices of the integrated circuit in a manner that minimizes the effects of variation in power supply, temperature, and fabrication process at a particular location within the integrated circuit. For example, a high speed differential amplifier used in an off-chip driver of a communication circuit needs a reference current to drive signals with required fixed amplitude onto a signal line towards a remote receiver, despite variations which occur in power supply, temperature, resistance values and fabrication process relative to particular locations of the chip.

As shown in FIG. 1, an exemplary high speed differential amplifier 10 drives differential outputs OUTP and OUTN based on the voltages of input signals INN and INP presented thereto. The differential amplifier 10 includes a "tail" transistor 20 which is coupled in mirror configuration to a first transistor 22 such that the tail transistor 20 generates a tail current It which is proportional to the reference current Ir through the first transistor 22. The tail current It is used to pull down one of the outputs OUTP or OUTN as a voltage drop across one of the on-chip load resistors RL by the quantity ItRL, based on the inputs INN and INP presented to the differential amplifier. When an output OUTP or OUTN is pulled down in use, the voltage drop across the corresponding one of the on-chip load resistors RL is required to be of fixed amplitude. Since the values of the on-chip load resistors RL vary with temperature and the fabrication process conditions, it will be understood that the reference current Ir, from which the tail current is mirrored, must not be constant, but rather must vary in a way to compensate for such temperature and process-related variations in resistance.

On the other hand, some circuits, which do not use on-chip resistors as load elements, are also required to provide output signals of fixed amplitude. For example, many different configurations of differential amplifiers are available which include transistors rather than resistors as load elements. In such cases, a reference current is needed which does not vary according to changes in an on-chip resistance, but rather, is independent from the variability of on-chip resistances.

Other problems of existing reference current generators are the chip area and power consumed by the placement of multiple independent reference current generators at different locations on a chip, such reference current generators including many elements that are duplicative. In addition, variations in the fabrication processing at such different chip locations may result in local variations in the generated reference currents. Therefore, a reference current generator system is desired which reduces demands on chip area and power consumption by eliminating duplicative elements and which provides uniform reference currents.

It would further be desirable for a reference current generator system to centrally generate a plurality of reference currents, and then distribute the reference currents to a plurality of different locations on a chip where a set of local reference currents are regenerated from the distributed reference currents and then used.

SUMMARY OF THE INVENTION

A system is provided for generating and distributing a plurality of reference currents on an integrated circuit. More particularly, in accordance with one aspect of the invention, an integrated circuit is provided which includes a reference current generating system. The reference current generating system includes a first reference current generator disposed at a first location of the integrated circuit which is operable to generate a plurality of first reference currents. A plurality of second reference current generators are disposed at a plurality of second locations of the integrated circuit. Each of the second reference current generators are operable to generate a second reference current from one of the plurality of first reference currents. In a particular example, the first location at which the first reference current generator is disposed is a central location and the plurality of second locations are remote from the first location.

In accordance with another aspect of the invention, an integrated circuit is provided which includes a reference current generating system, in which the reference current generating system includes means disposed at a first location of the integrated circuit for generating a plurality of first reference currents. Means are further provided for distributing the plurality of first reference currents to a plurality of second locations of the integrated circuit; and means are disposed at the plurality of second locations remote from the first location for generating a plurality of second reference currents from the first reference currents.

In accordance with another aspect of the invention an integrated circuit is provided which includes a first reference current generator disposed at a first location of the integrated circuit, the first reference current generator operable to generate a first reference current. The integrated circuit further includes a reference current regenerating circuit disposed at a second location of the integrated circuit remote from the first location. The reference current regenerating circuit is operable to produce a regenerated first reference current from the first reference current using a mirroring circuit, the mirroring circuit including a first transistor having a biasing input tied to a biasing input of a mirror transistor. A plurality of second reference current generators included in the integrated circuit are operable to generate a plurality of second reference currents by generating a reference voltage from the regenerated first reference current and applying the reference voltage to biasing inputs of a plurality of second transistors to generate the plurality of second reference currents.

DETAILED DESCRIPTION OF THE PREFERRED EMBODIMENTS

Figure 2:
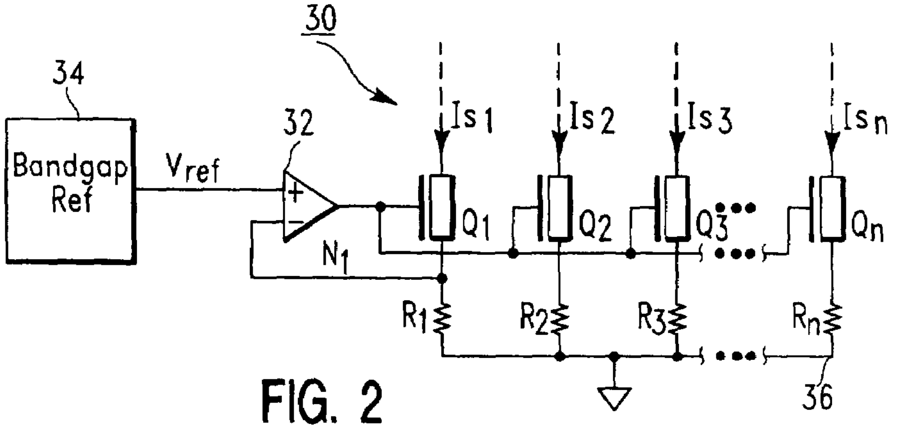
FIG. 2 is a block and schematic diagram illustrating a first preferred embodiment of a reference current generator.

A first preferred embodiment of a reference current generator 30 is illustrated in FIG. 2. In this embodiment, reference currents are generated which change with variations in the resistance of on-chip resistors, in such way as to compensate for variations in the resistance of load resistors in the end use circuit (e.g. differential amplifier) where the reference current is used. As shown in FIG. 2, an operational amplifier 32 is coupled to receive, at a positive input, a stable reference voltage Vref, for example, from a bandgap reference generator 34. A bandgap reference generator generates a constant voltage output which is independent of power supply, temperature and process variations.

An insulated gate field effect transistor (IGFET) Q1, preferably of n-type (an NFET), but permissibly of p-type (a PFET), has a gate to which the output of the operational amplifier 32 is coupled as a biasing input. The output node N1 from the source of the transistor Q1 is coupled to a resistor R1, which in turn, is coupled to a fixed potential 36, such as ground. Preferably, resistor R1 and resistors R2, 3, . . . Rn are on-chip resistors which vary in resistance as to temperature and process conditions, including their directional orientation on the chip, so as to compensate for similar variations in resistance of other on-chip resistors to which the reference currents are applied in end use circuits. However, as an alternative, it may be desirable to place the resistors R1, R2, R3 . . . Rn off the chip to limit such variations in resistance and to save chip area, when it is not needed to generate currents that compensate for variations in the resistance in end use circuits.

The output N1 of transistor Q1 is further coupled as feedback to the negative input of the operational amplifier 32. In such way, operational amplifier 32 maintains transistor Q1 biased to conduct a reference current Is1 which varies with the resistance of a resistor R1, such variations as may occur with temperature and the fabrication process, for example. The output of operational amplifier 32 is also coupled as biasing inputs to the gates of one or more second transistors Q2, Q3, . . . Qn, being NFETS, when the first transistor Q1 is an NFET, and being PFETs when the first transistor Q1 is a PFET. Each of the second transistors Qi has an output, for example, the source when the transistor is an NFET, which is coupled to a corresponding resistor Ri, which in turn, is coupled to the fixed potential, e.g. ground. When the second transistors Qi are PFETs, the output of each PFET Qi, from the drain, is coupled to a corresponding resistor Ri, which in turn, is coupled to the fixed potential, e.g. ground. The resistance values of all the resistors Ri, R2, R3, . . . Rn are preferably set equal so as to bias the transistors Q1, Q2, Q3, . . . Qn each to conduct a reference current Isi in the same amplitude as each other, but permitting, however, some statistically acceptable variation. The operational amplifier 32 maintains each second transistor Qi biased to conduct a reference current Isi.

However, unlike the output N1 of the first transistor Q1, an important feature of this embodiment is that the outputs of the second transistors Qi are not coupled as feedback to the operational amplifier 32, helping to make possible high output impedance while conserving chip area. High output impedance is important in order to provide stable reference current outputs, good noise rejection, and to reduce the effects of power supply variations. As will be understood, by not coupling the outputs of all transistors to the operational amplifier, the output impedance of each branch of the generator through a transistor Qi can be maintained higher than otherwise. If the outputs of all transistors were coupled as feedback to the operational amplifier 32, then all of those outputs would be at the same potential, and a parallel current path would exist through resistors Ri, R2, R3, . . . Rn to ground, reducing the output impedance of each branch by 1/n times. Low output impedance is undesirable as it can result in high power consumption and impedance mismatch between the output of the reference current generator and the end use circuit (e.g. differential signal amplifier) which uses the reference current. Without this important feature of the embodiment, to achieve the required output impedance, it would be necessary to increase the size of each resistor by n times to nRi, or to construct separate reference current generators, each one having a bandgap reference generator and generating just one reference current. Such alternatives are undesirable as each one of them requires much greater chip area to implement.

In operation, a reference voltage Vref is provided as a positive input to operational amplifier 32 from a stable voltage source such as a bandgap reference generator 34. The operational amplifier 32 produces an output that biases the gate of the first transistor Qi to conduct a reference current Isi. Since the output N1 of the first transistor is coupled to the negative input of the operational amplifier 32 as feedback thereto, the action of the operational amplifier 32 maintains the output N1 at the reference voltage Vref. The amount of current through resistor R1 is therefore determined to be Vref/R1, and the amount of the reference current Is1 through Q1 is the same.

Figure 3:
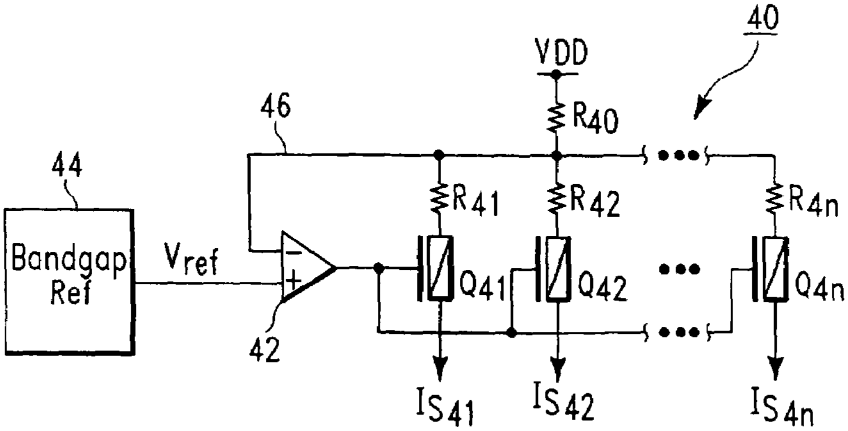
FIG. 3 is a block and schematic diagram illustrating a second preferred embodiment of a reference current generator.

A second embodiment of a reference current generator is illustrated in FIG. 3. In this embodiment, a plurality of reference currents Is41, Is42, . . . Is4*n* are generated which are substantially independent of the resistances of resistors R41, R42, . . . R4*n* which are used in the respective branches of the reference current generator. In this embodiment, as in the first embodiment, a reference voltage from a bandgap reference generator 44 is provided to the positive input of the operational amplifier 42. The output of the operational amplifier is provided to the gates of a plurality of transistors Q41, Q42, . . . Q4*n* as biasing inputs thereto. Feedback to the negative input of the operational amplifier 42 is provided from a node 46 to which all branch resistors R41, R42, . . . R4*n* and resistor R40 are coupled. By the action of the operational amplifier 42, node 46 will be held at the reference voltage, and the current through resistor R40 is (1/R40) (VDD−Vref). Since the values of resistors R41, R42, . . . R4*n*, which may be located either on the chip or off the chip, are also the same or nearly the same, it will be understood that the quantity of the reference current Isi through each branch of the reference current generator 40 is (1/n)(1/R40)(VDD−Vref), n being the number of branches, i.e. the number of reference currents output from the reference current generator 40.

In this embodiment, the value of the reference currents Is41, Is42, . . . Is4*n* depends mainly on the resistance value of R40, which is preferably located off of the chip such that its resistance is well controlled (typically within a tolerance of plus or minus one per cent). On the other hand, resistors R41, R42, . . . R4*n* are used principally to bias transistors Q41, Q42, . . . Q4*n* for high output impedance and have little effect on the value of each reference current.

Transistors Q41, Q42, . . . Q4*n* are preferably all of the same size, characteristics, and type. In a preferred embodiment, transistors Q41, Q42, . . . Q4*n* are selected to be p-type insulated gate field effect transistors (PFETs), especially for the purpose of reducing power consumption, since the use of PFETs here permits the supply voltage and reference voltage to be set for low power consumption. For example, good results can be achieved while conserving power when PFET transistors are used and the supply voltage VDD is set at a level only slightly higher than the reference voltage Vref (e.g., 100 mV higher). However, n-type insulated gate field effect transistors (NFETs) can be used for Q41, Q42, . . . Q4*n* instead of PFETs if the design permits a greater voltage difference between the supply voltage VDD and the reference voltage Vref.

Figure 4:
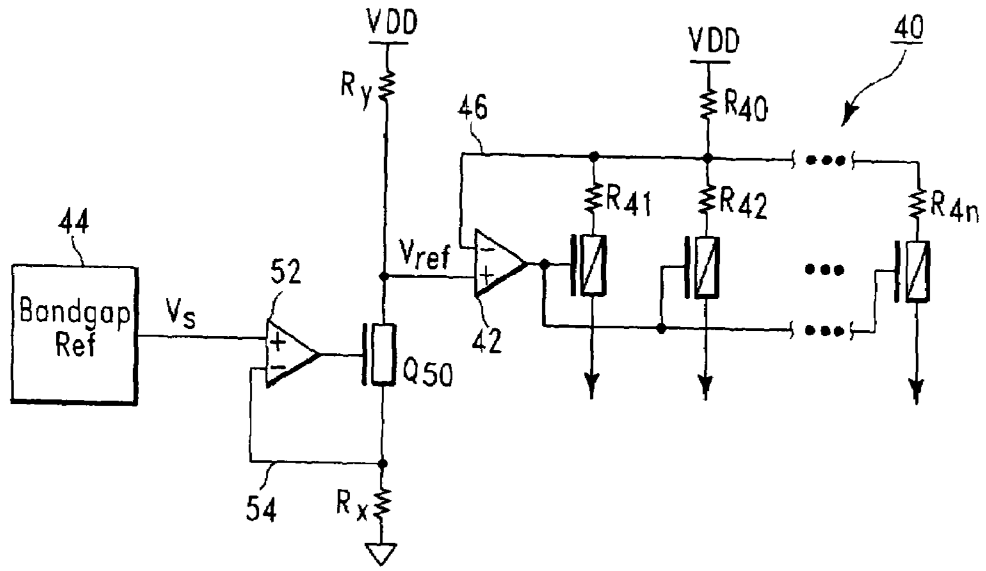
FIG. 4 is a block and schematic diagram illustrating a modified second embodiment of a reference current generator.

It will be understood that, in the second embodiment, although reference currents Isi are generated which are substantially free from the effects of variations in resistance values of the circuit, the reference currents are still very much affected by fluctuation in the supply voltage VDD. Accordingly, in a third embodiment, as shown in FIG. 4, an addition is made to the circuit to make the reference current values independent from the supply voltage VDD. In this embodiment, Vref, rather than being provided directly from a bandgap reference generator 44, as in the second embodiment, is now provided as an output of a transistor Q50, which is coupled as feedback to an added operational amplifier 52. The added operational amplifier 52 receives a stable voltage input Vs from a bandgap reference generator 44.

As shown in FIG. 4, transistor Q50 is preferably an NFET; however, a PFET transistor can be used instead of an NFET under appropriate biasing conditions. The source of NFET transistor Q50 is coupled at node 54 to operational amplifier 52. By the action of the operational amplifier 52, node 54 is maintained at the stable voltage Vs. A resistor Rx is placed between node 54 and a fixed potential such as ground. Consequently, the current flow from node 54 to ground is equal to Vs/Rx. From the output (drain) of transistor Q50 a reference voltage Vref is supplied as input to operational amplifier 42. As Vref is determined by the resistive voltage drop due to the current through Ry, Vref is equal to VDD−(Ry)(Vs/Rx), or expressed differently, Vref=VDD−Vs(Ry/Rx). It will be further understood that node 46 is held at this voltage VDD−Vs(Ry/Rx), and that each generated reference current Is41, Is42, Is4*n* is equal to (1/n)(1/R40)(VDD−(VDD−Vs(Ry/Rx))): that is, Isi=(1/n)(1/R40)(Vs)(Ry/Rx), which is independent of the supply voltage VDD. Moreover, when an off the chip, fixed value resistor is used as R40, it will be understood that each reference current Is4*i* remains essentially constant despite temperature variation, because the resistance of R40 is fixed and that the ratio Ry/Rx of the resistances tends to cancel out any variations which may occur.

Figure 5:
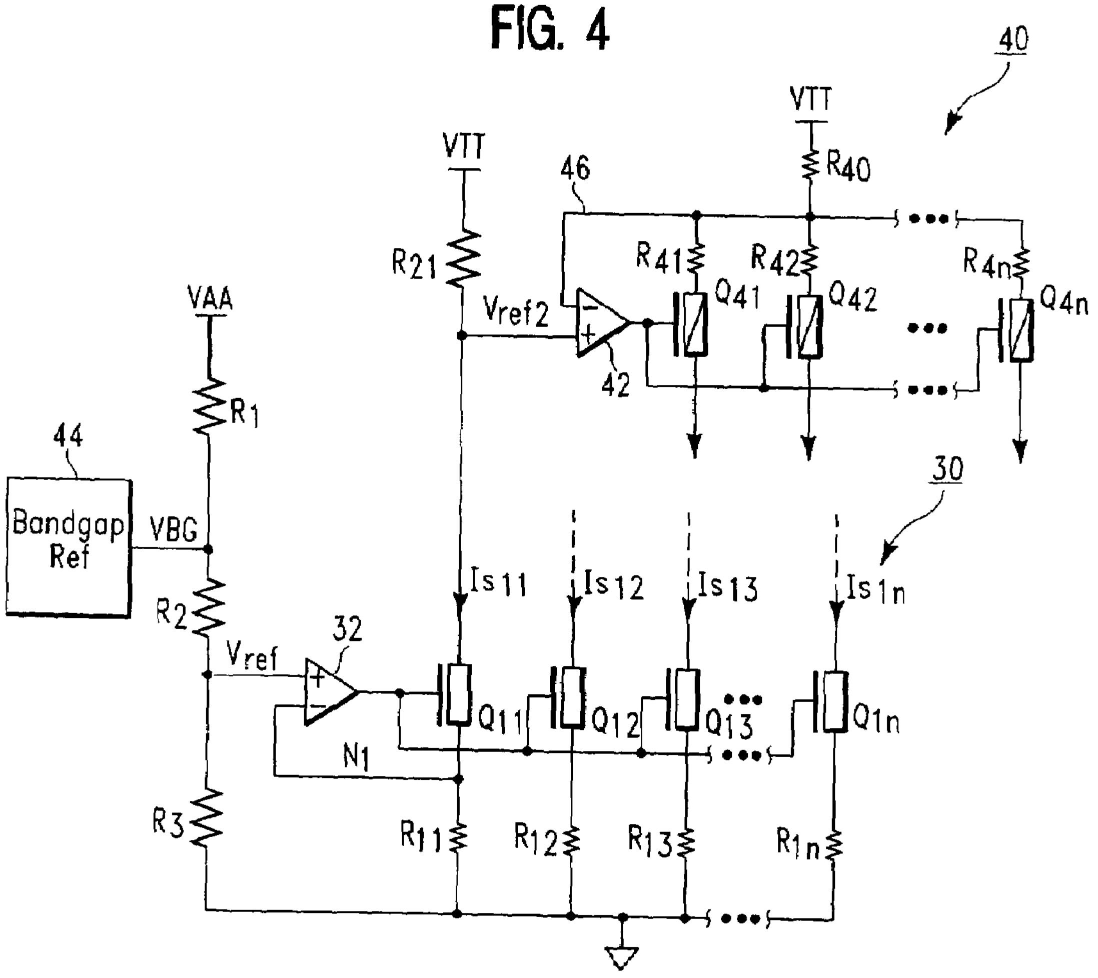
FIG. 5 is a block and schematic diagram illustrating an embodiment in which a second reference current generator is coupled in tandem to a first reference current generator.

A further reference current generator embodiment is shown in FIG. 5. In this embodiment, a second reference current generator 40, of the type shown in FIG. 3, is operated in tandem with a first reference current generator 30, of the type shown in FIG. 2. The second reference current generator 40 is operated by a second reference voltage input Vref2 which is determined by a voltage drop due to a reference current Is11 across a resistor R21 coupled to the supply voltage VTT, the reference current Is11 supplied from the first reference current generator 30. In this manner, which is different from the embodiments of FIGS. 2 and 3, there is no need for reference the second reference current generator 40 to a voltage input directly from a bandgap reference generator 44. Thus, the need for an additional bandgap reference generator 44 is eliminated, thereby permitting power and chip area to be conserved.

Another difference in this embodiment from those of FIGS. 2 and 3 relates to the way that the first reference voltage input Vref is generated and provided to the operational amplifier 32. As shown in FIG. 5, a bandgap reference voltage VBG is output from the bandgap reference generator 44. However, in this case, the supply voltage VAA to the bandgap reference generator 44 is selected independently from the supply voltage VTT provided to the first and second reference current generators 30 and 40. In such manner, the supply voltage VM can be made higher than the supply voltage VTT to the first and second reference current generators 30 and 40, so as to enable better performance and better immunity to fluctuations in the supply voltage VAA. It will be understood that the reference voltage Vref provided to operational amplifier 32 is divided down from the bandgap reference voltage VBG by resistors R2, and R3, such that the reference voltage Vref=(VBG)(R3/(R2+R3)), a quantity which should remain substantially constant despite changes in conditions, since the resistances of R2 and R3 are all expected to vary in the same direction. Because the bandgap reference voltage VBG is now divided prior to input to the reference current generator 30, the supply voltage VTT can also be lowered independently of the bandgap reference voltage VBG, for conserving power, for example.

Since node N1 of reference current generator 30 is held at Vref, then the reference current Is11 is determined to be Vref/R11; that is, $$Is11=(1/R11)(VBG)(R3/(R2+R3).$$

This quantity, like the reference currents Isi of the embodiment of FIG. 2, is dependent upon the value of the resistor (R11) that is coupled to the output of the transistor (Q11). Therefore, the reference current Is11 (as well as reference currents Is12, Is13, . . . Is1*n*) are available to compensate for variations in the resistances of circuits that use them.

It will be understood that even though a resistance dependent reference current Is11 is used to generate a second reference voltage Vref2 input to the second reference current generator 40, the second reference voltage Vref2 is substantially independent from variations in resistance. The second reference voltage Vref2 is determined by Vref2=VTT−(R21)(Is11); that is, using the above equation for Is11, Vref2=(R21/R11)(VBG)(R3/(R2+R3).

Figure 6A:
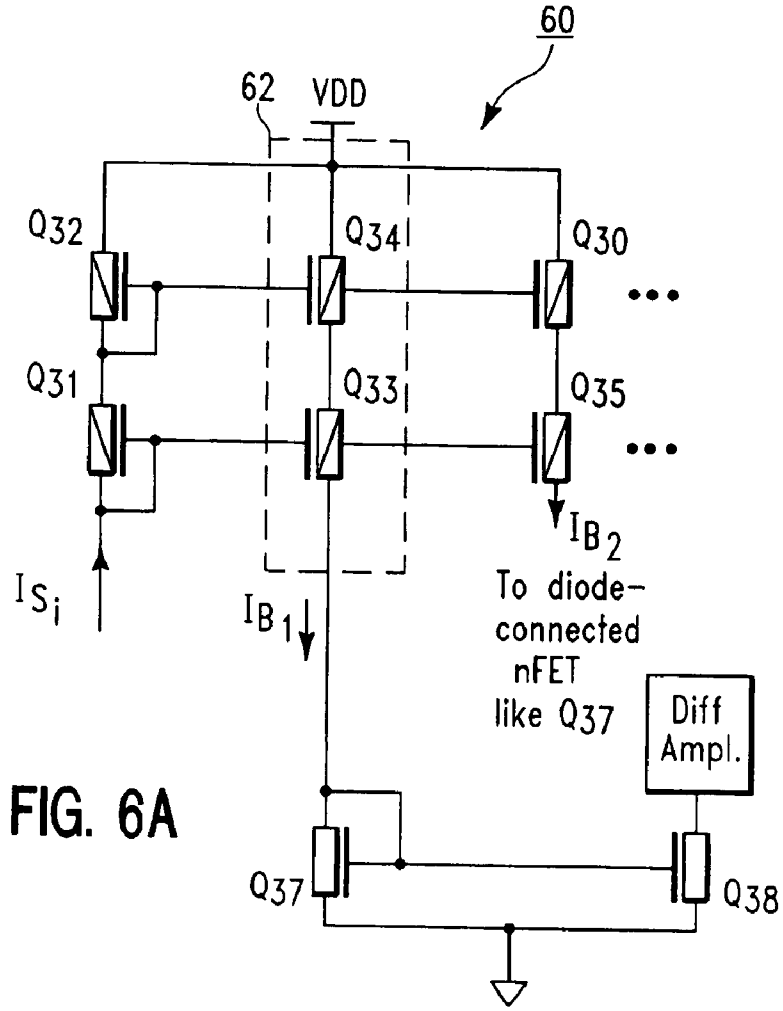
FIGS. 6A through 6C are diagrams illustrating aspects of reference current distribution systems.

FIG. 6A illustrates a local regenerating circuit 60 for mirroring and distributing a received reference current Isi (such as from the reference current generator 30 of FIG. 2) as a plurality of local regenerated reference currents IB1, IB2, etc. As shown in FIG. 6A, a reference current Isi is input to the drain of a diode-connected PFET Q31, which is preferably series connected to a second diode-connected PFET Q32, coupled to a voltage supply VDD. Pairs of series-connected PFET transistors Q33 and Q34, coupled to PFETS Q31 and Q32 in a current mirror configuration, are preferably sized a multiple of the sizes of the transistors Q31 and Q32 coupled to them so that the mirrored currents IB1, IB2, etc. that are a multiple of the incoming reference current Isi. In a first branch 62 of the local regenerating circuit 60, the incoming reference current Isi is mirrored by a PFET Q33 having its gate tied to the gate of diode-connected PFET Q31. PFET Q34 also mirrors the incoming reference current Isi, Q34 also having its gate tied to the gate of PFET Q32. The series connection of PFETs Q33 and Q34 in the branch 62 helps to assure the accuracy and stability of the mirrored current. Preferably, all of the PFETs of the local regenerating circuit 60 are located close to each other, rather than in different areas of the chip, such that all of them have the same or very little variation in threshold voltage and a variation in the supply voltage will not affect the quantity of the locally regenerated reference current IBi. If the supply voltage does vary for these closely located PFETs, the gate source voltage Vsg of all the PFETs will vary in the same way at the same time, such that the effect upon operation in the circuit 60 will be minimal.

Figure 6B:
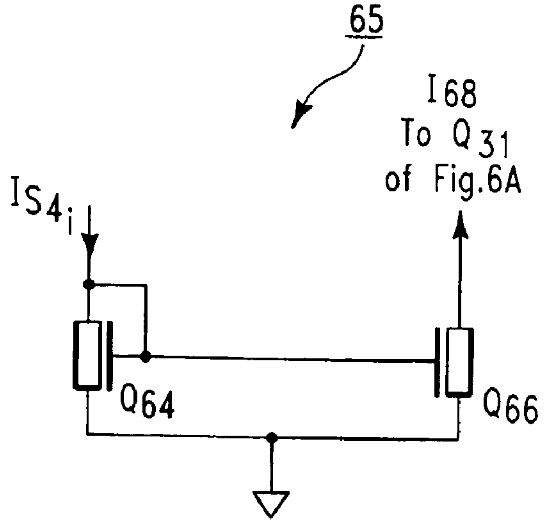

It will be understood that the local regenerating circuit of FIG. 6A is not arranged to permit direct use of the reference current outputs Is41, Is42, etc. of the embodiment of FIG. 3. FIG. 6B illustrates a circuit 65 which allows such a reference current Is4*i* to be converted into a suitable input current for use in the local regenerating circuit 60 of FIG. 6A. As shown in FIG. 6B, a reference current Is4*i* is input to the drain of a diode-connected NFET Q64, having a gate tied to the gate of a mirroring NFET Q66, which has the same type as NFET Q64, but which may preferably be longer than NFET Q66 in order to mirror an output current that is a multiple of the incoming reference current Is4*i*. Both NFET Q64 and NFET Q66 preferably have their sources coupled to ground, as shown. By such arrangement, a converted reference current I68 is output for use in the local regenerating circuit 60 of FIG. 6A.

Figure 6C:
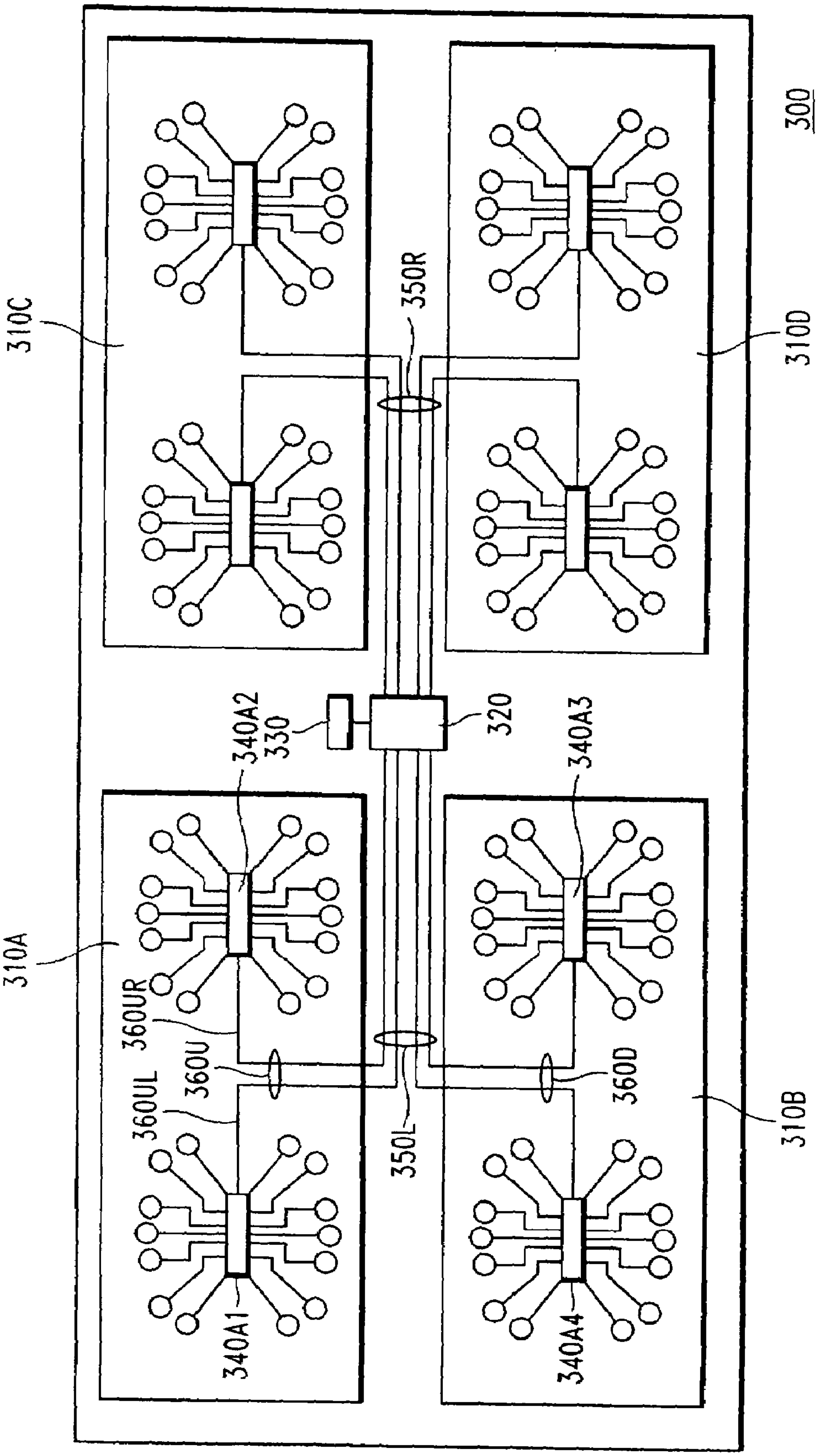

FIG. 6C illustrates a network system 300 for generating and distributing reference currents over a plurality of areas of an integrated circuit. As shown in FIG. 6C, a reference current generator 320, coupled to a bandgap reference voltage generator 330, is located in the system 300 between a plurality of areas on the IC, shown exemplarily as quadrants 310A–310D, so as to provide a reference current on a wire, for example the wire 360UL, to a local regenerating circuit, for example circuit 340A1 coupled to the wire 360UL. Collectively, the four wires of the left group 350L provide one reference current each to the four local regenerating circuits 340A1–340A4 that lie to the left of the central reference current generator 320. Similarly, the four wires of the right group 350R provide one reference current to each of the local regenerating circuits in each of the areas 310C and 310D.

Several advantages are achieved through the network system 300 of this embodiment. First, since reference currents are generated centrally and then distributed and locally regenerated in other parts of the chip, the variation that may occur between independently generated reference currents in different areas of the chip is eliminated. In addition, since reference currents, rather than reference voltages, are transferred from one part of the chip to another, the transferred reference currents are less likely to be affected by noise disturbance across areas of the chip than is the case with voltages. In the network system 300, voltages are transferred between devices only in localized areas of the chip that are served by a locally regenerated reference current from a local regenerating circuit, e.g. circuit 340A1. Second, only one reference current generator 320 and only one bandgap reference generator 330 are required for the network system 300. This is an advantage over chips in which reference currents are independently generated in several parts of the chip, thus requiring multiple reference current generators and bandgap reference generators. The reduction in the number of reference current generators and bandgap reference generators, both of which require relatively high power consumption and large area, leads to savings of power and chip area.

Figure 7A:
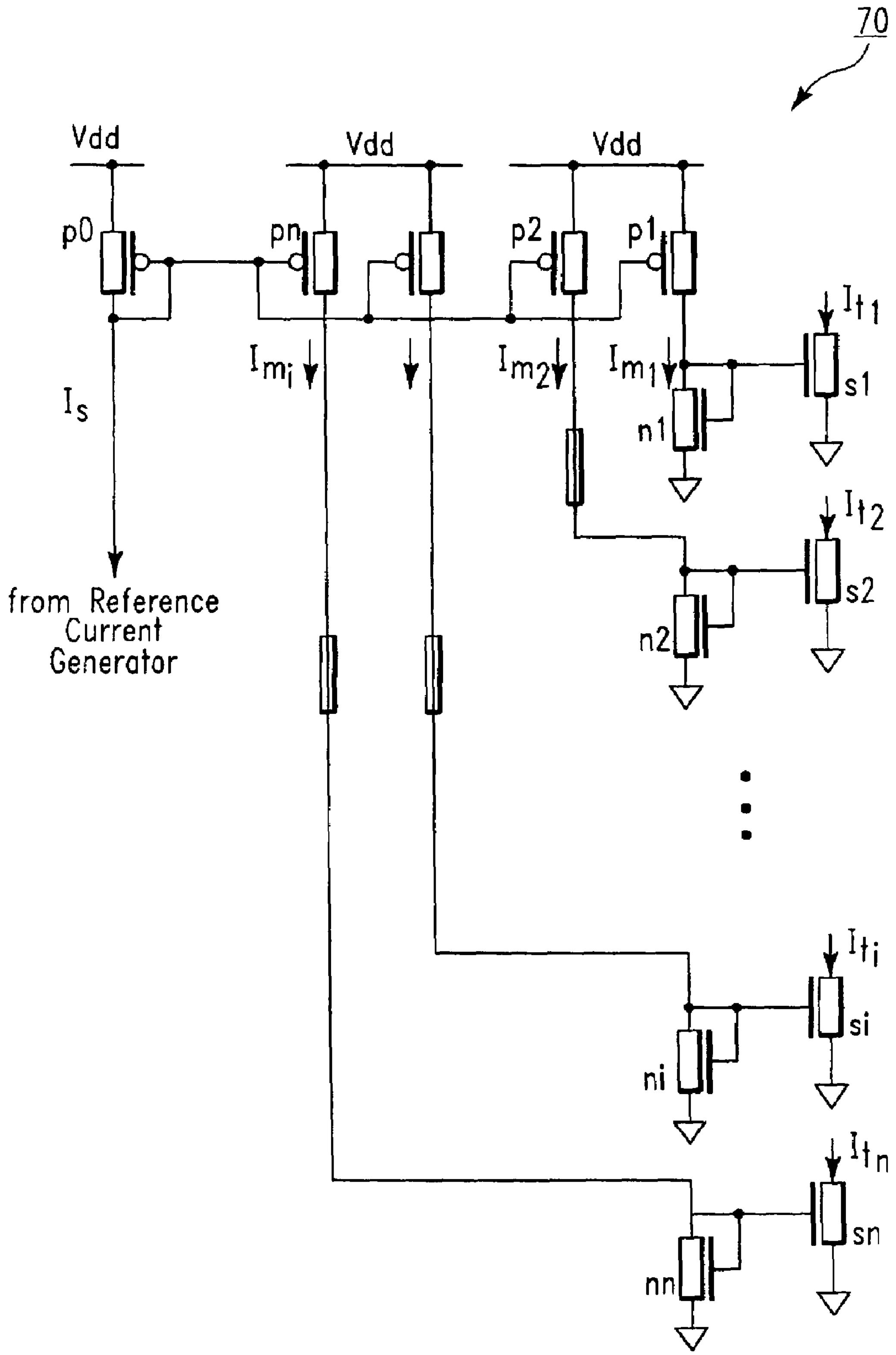
FIG. 7A Prior Art
FIG. 7A is a schematic diagram illustrating a prior art circuit for mirroring and distributing a reference current to a plurality of end use circuits.

FIG. 7A illustrates a prior art local current mirroring circuit 70 for mirroring an incoming reference current Is from a diode-connected PFET p0, by a plurality of PFET mirror devices p1, p2, . . . pn, to a plurality of mirrored currents Im1, Im2, . . . Imn. As in the foregoing embodiment described relative to FIG. 6A, the quantity of the mirrored current Im1 depends on the size of the PFET mirror device, e.g. p1, relative to the size of the diode-connected PFET p0 to which it is connected. The mirrored currents Im1, Im2, . . . Imn, in turn, are mirrored from a plurality of diode-connected NFETs n1, n2, . . . nn by having gate bias inputs coupled to a plurality of corresponding NFET tail transistors s1, s2, . . . sn, to generate a plurality of "tail" currents It1, It2, . . . Itn.

In this circuit 70, all of the PFETs p0, p1, . . . pn are located close to each other so as to reduce the possibility of variation in their threshold voltages, or disturbance due to a variation in the supply voltage VDD. The diode-connected NFETs n1, n2, . . . nn are located close to the respective tail devices s1, s2, . . . sn to which they are connected such that they too vary little in threshold voltage and are little affected by noise imparted from ground at the particular location since the both the diode-connected device n1 and the tail device s1 will be affected in the same way at that time. In this way, the prior art circuit 70 of FIG. 7A provides a high quality current transfer characteristic which is relatively immune to noise disturbance.

Figure 7C:
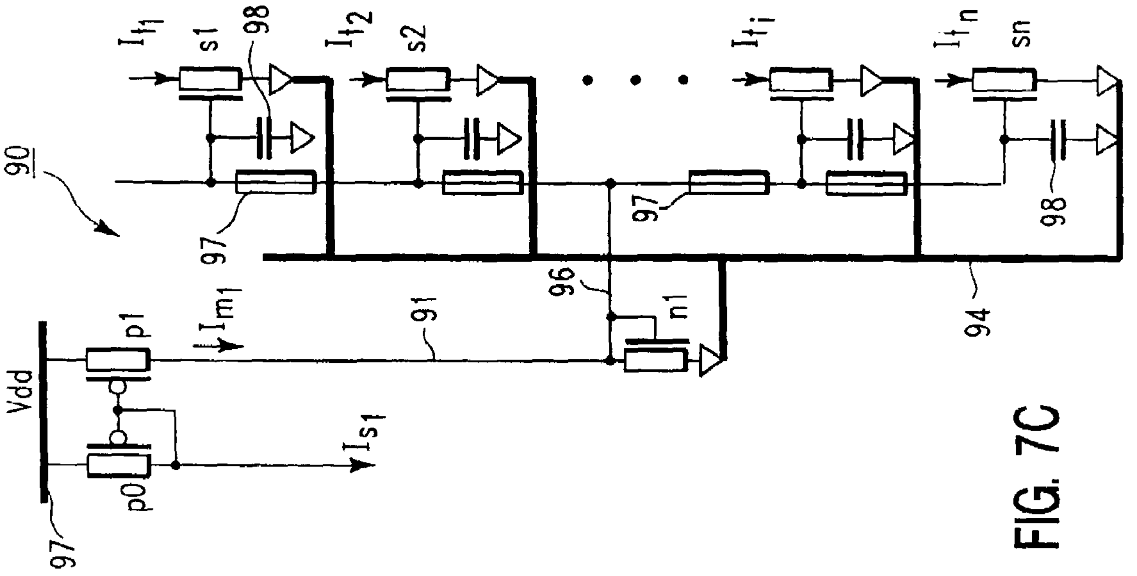
FIGS. 7B and 7C are schematic diagrams illustrating improved circuit embodiments for mirroring and distributing a reference current to a plurality of end use circuits.
Figure 7B:
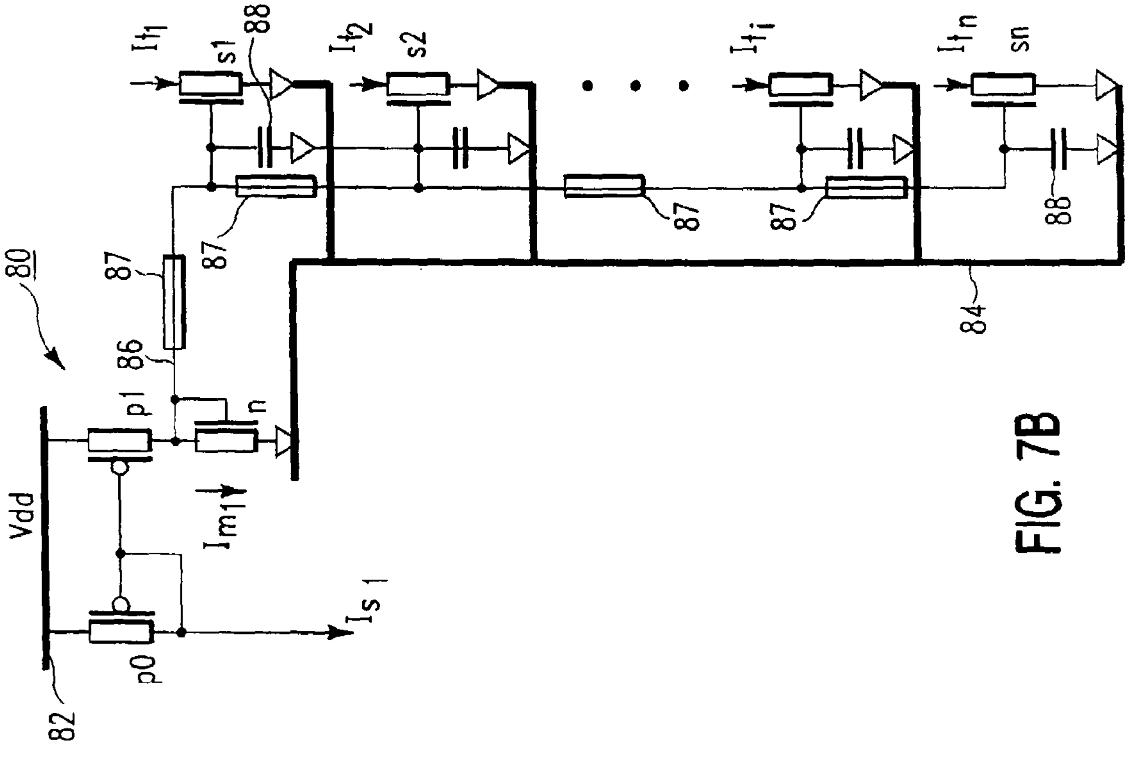

However, the circuit 70 of FIG. 7A consumes much power and chip area. It would be desirable to reduce the number of transistors therein while still maintaining good noise immunity, in order to reduce the consumption of power and chip area. Accordingly, local current mirroring circuits 80 and 90 are shown in FIGS. 7B and 7C which address these concerns. In these embodiments, unlike that shown in FIG. 7A, a reference voltage, rather than a plurality of mirror currents, transfers the bias between an NFET n1 coupled to receive a mirrored current Im1 and a plurality of tail devices s1, s2, . . .sn. By doing so, the number of PFET mirror transistors p1, p2, . . . and diode-connected NFET devices n1, n2, . . . of these embodiments are reduced from one PFET and one NFET for every tail device s1, as shown in FIG. 7A, to only one PFET and only one NFET per each group of many tail devices s1, s2, . . . sn. However, because of the greater potential for noise disturbance when a voltage is transferred from on chip location to another, rather than a current, certain other modifications are necessary to preserve good noise immunity.

Figure 1:
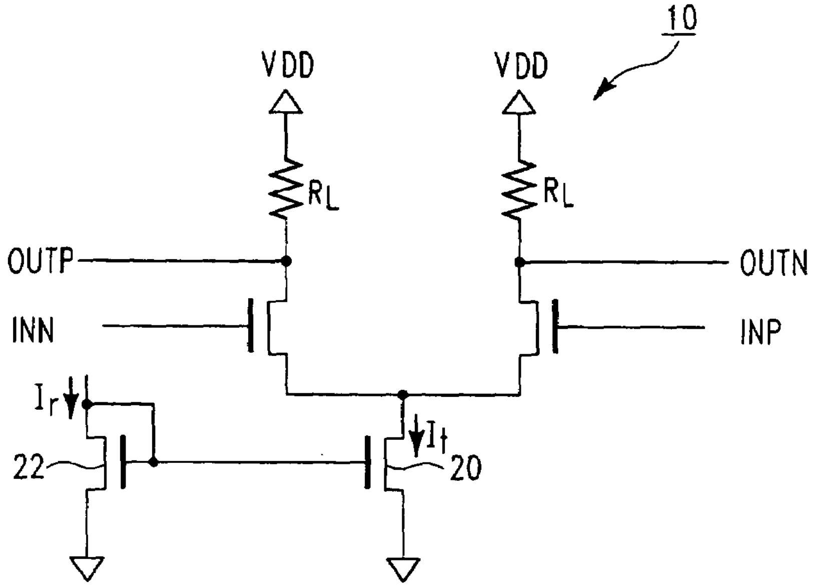
FIG. 1 Prior Art
FIG. 1 is a schematic diagram illustrating a prior art differential amplifier.

In the embodiment 80 shown in FIG. 7B, the connection to and quality of the voltage supply VDD are enhanced locally where contacted by the diode-connected PFET p0 and the PFET mirror device p1. In addition, the connection to and quality of the ground line 84 are enhanced where contacted by NFET n1 and the tail devices s1, . . . sn. The incoming reference current Is1 is mirrored from PFET p0 to PFET p1 and the mirrored current Im1 is then driven through the diode-connected NFET n1 to ground to generate a reference voltage on line 86. The reference voltage line 86, connected to the gates of the tail devices s1, s2, . . . sn, then allows the current Im1 to be mirrored from NFET n1 to a plurality of tail devices s1, s2, . . . sn, such as may each be coupled to a differential amplifier, as shown in FIG. 1, for example. Since the tail devices may not all be in the same location, filtering is added to reduce possible noise disturbance. Such filtering is accomplished, for example, by insertion of a plurality of resistive elements 87 along the reference voltage line 86 and placing capacitors 88 at the input to the tail devices s1, s2, etc., between the reference voltage line 86 and ground.

In the embodiment 90 shown in FIG. 7C, as in the embodiment shown in FIG. 7B, the connection to and quality of the voltage supply VDD 92 are enhanced locally where contacted by the diode-connected PFET p0 and the PFET mirror device p1, and the connection to and steadiness of the ground line 94 are enhanced where contacted by NFET n1 and the tail devices s1, . . . sn. As in FIG. 7B, the incoming reference current Is1 is mirrored from PFET p0 to PFET p1. The mirrored current Im1 is then driven along a wire 91 from the location near the PFET mirror device p1 to a location of the diode-connected NFET n1 which is central to the NFET tail devices s1, s2, . . . sn. At that location, the mirrored current Im1 is then driven through the diode-connected NFET n1 to ground to generate a reference voltage on line 96. The reference voltage line 96, connected to the gates of the tail devices s1, s2, . . . sn, then transfers the bias locally for the current Im1 to be mirrored from NFET n1 to a plurality of tail devices s1, s2, . . . sn. Since the tail devices may not all be in the same location, filtering is added to reduce possible noise disturbance along the reference voltage line 96. Such filtering is accomplished, for example, by insertion of a plurality of resistive elements 97, each one adjacent to each tail device s1, etc. along the reference voltage line 96, and placing capacitors 98 at the input of each tail devices s1, s2, etc. between the reference voltage line 96 and ground 94.

In the foregoing described manner, in the circuit embodiments shown in FIGS. 7B and 7C, the number of PFET mirror transistors and corresponding diode-connected NFET transistors are reduced from one PFET and one NFET per every tail device s1, s2, . . . sn, to only one PFET and only one NFET per each group of many tail devices s1, s2, . . . sn. This, in turn, reduces the power and chip area that each circuit embodiment 80 or 90 requires, while still maintaining adequate noise immunity through use of enhanced connections to the voltage supply and ground and adding filtering to the reference voltage line 86 or 96 which transfers the bias signal to each of a plurality of attached tail devices s1, s2, . . . sn.

While the invention has been described with respect to certain preferred embodiments thereof, those skilled in the art will understand the many modifications and enhancements that can be made without departing from the true scope and spirit of the appended claims.

What is claimed is:

1. An integrated circuit including a reference current generating system, the reference current generating system comprising:

a first reference current generator disposed at a first location of said integrated circuit, said first reference current generator operable to generate a plurality of first reference currents;

a plurality of wires for conducting said plurality of first reference currents from said first location to a plurality of second locations within second areas of said integrated circuit at distances from said first location; and a plurality of second reference current generators disposed at said plurality of second locations of said integrated circuit and coupled to said plurality of wires to receive said plurality of first reference currents substantially free from noise disturbance despite said distances crossed by said plurality of wires, each of said second reference current generators operable to locally generate a second reference current from one of said plurality of first reference currents for use at one of said plurality of second locations.

2. The integrated circuit as claimed in claim 1, wherein each of said second reference current generators includes a current mirror circuit operable to mirror said second reference current from said one of said plurality of first reference currents.

3. The integrated circuit as claimed in claim 1, wherein said first reference current generator is operable to generate said plurality of first reference currents using a stable reference voltage and a plurality of generator transistors Qi, each of said generator transistors Qi having an output coupled to a fixed potential through a resistor.

4. The integrated circuit as claimed in claim 1, wherein said second locations are remote from said first location.

5. The integrated circuit as claimed in claim 4, wherein said first location is central to said integrated circuit.

6. An integrated circuit including a reference current generating system, the reference current generating system comprising:

means disposed at a first location of said integrated circuit for generating a plurality of first reference currents;

means for distributing said plurality of first reference currents to a plurality of second locations within second areas of said integrated circuit at distances from said first location; and means disposed at each of said plurality of second locations remote from said first location for receiving said plurality of first reference currents from said distributing means substantially free from noise disturbance despite said distances crossed by said distributing means, and for generating a plurality of second reference currents from said first reference currents for use at each of said second locations.

7. The integrated circuit as claimed in claim 6, wherein said means for generating said plurality of first reference currents generates said plurality of first reference currents through current mirroring.

8. The integrated circuit as claimed in claim 7, wherein said means for generating said plurality of first reference currents generates said plurality of first reference currents from a stable reference voltage.

9. The integrated circuit as claimed in claim 8, wherein said stable reference voltage is referenced to an output of a bandgap reference generator.

10. An integrated circuit, comprising:

a first reference current generator disposed at a first location of said integrated circuit, said first reference current generator operable to generate a first reference current;

a reference current regenerating circuit disposed at a second location of said integrated circuit remote from said first location, said reference current regenerating circuit operable to produce a regenerated first reference current from said first reference current using a mirroring circuit, said mirroring circuit including a first transistor having a biasing input tied to a biasing input of a mirror transistor; and a plurality of second reference current generators operable to generate a plurality of second reference currents by generating a reference voltage from said regenerated first reference current and applying said reference voltage to biasing inputs of a plurality of second transistors to generate said plurality of second reference currents.

11. The integrated circuit as claimed in claim 10, wherein said plurality of second reference current generators are operable to filter said reference voltage prior to applying said reference voltage to said biasing inputs.

12. The integrated circuit as claimed in claim 11 further including a conductive line operable to conduct said reference voltage, and a plurality of resistive and capacitive elements coupled to said conductive line, said resistive and capacitive elements functioning to perform said filtering.

13. The integrated circuit as claimed in claim 11, wherein said reference current regenerating circuit is disposed at a location central to said plurality of second transistors.

* * * * *